(12) United States Patent
Harris et al.

(10) Patent No.: US 6,325,886 B1
(45) Date of Patent: Dec. 4, 2001

(54) METHOD FOR ATTACHING A MICROMECHANICAL DEVICE TO A MANIFOLD, AND FLUID CONTROL SYSTEM PRODUCED THEREBY

(75) Inventors: James M. Harris, Menlo Park; Michael J. Selser, Livermore; Walter A. Weber, Campbell, all of CA (US)

(73) Assignee: Redwood Microsystems, Inc., Menlo Park, CA (US)

( * ) Notice: Subject to any disclaimer, the term of this patent is extended or adjusted under 35 U.S.C. 154(b) by 0 days.

(21) Appl. No.: 09/503,443

(22) Filed: Feb. 14, 2000

(51) Int. Cl.$^7$ .............................. B32B 31/00; F16K 7/00
(52) U.S. Cl. ................ 156/314; 137/15.01; 137/605; 137/884
(58) Field of Search ................ 137/269, 271, 137/884, 15.01, 605; 156/314, 295

(56) References Cited

U.S. PATENT DOCUMENTS

| | | | |
|---|---|---|---|
| 4,051,286 | * 9/1977 | Abbott | 156/314 X |
| 4,793,886 | * 12/1988 | Okamura et al. | 156/314 X |
| 5,084,119 | * 1/1992 | Barksdale | 156/314 X |
| 5,568,713 | * 10/1996 | Gagne et al. | 156/341 X |
| 5,964,239 | * 10/1999 | Loux et al. | 137/884 X |
| 6,048,433 | * 4/2000 | Maesaka et al. | 156/314 |
| 6,123,107 | * 9/2000 | Selser et al. | 137/884 |

\* cited by examiner

Primary Examiner—Mark A. Osele
(74) Attorney, Agent, or Firm—Pennie & Edmonds LLP

(57) ABSTRACT

A method of attaching a micromechanical fluid control device to a substrate includes the steps of forming a first ring of a first adhesive around an aperture defined between a micromechanical fluid control device and a substrate. The first adhesive forms a first interface between the micromechanical fluid control device and the substrate that is clean and corrosion resistant. A second ring of a second adhesive is applied around the first ring. The second adhesive forms a second interface between the micromechanical fluid control device and the substrate that is hermetic.

18 Claims, 2 Drawing Sheets

METHOD FOR ATTACHING A MICROMECHANICAL DEVICE TO A MANIFOLD, AND FLUID CONTROL SYSTEM PRODUCED THEREBY

BRIEF DESCRIPTION OF THE INVENTION

This invention relates generally to micromechanical devices used to control fluids. More particularly, this invention relates to a technique for establishing a clean, corrosion resistant, and hermetic connection between a micromechanical device and a fluid manifold substrate.

BACKGROUND OF THE INVENTION

Micromechanical devices (also called microelectromechanical (MEM) devices, micromachined devices, and nanostructures) are micron scale, three-dimensional objects constructed using semiconductor processing techniques. As used herein, the term micromechanical refers to any three-dimensional object that is at least partially constructed in reliance upon semiconductor processing techniques.

Micromechanical devices are utilized as fluid control devices. As used herein, the term fluid refers to either a gas or a liquid. Precise fluid control is important in many applications ranging from drug delivery to semiconductor processing equipment.

Micromechanical devices are used to form a variety of fluid flow control devices, including shut-off valves, pressure sensors, mass flow controllers, filters, purifiers, pressure gauges, and the like. FIG. 1 is a side cross-sectional view of a prior art device including a manifold 20 with an input port 22 and an output port 24. Mounted on the manifold 20 is a first micromechanical fluid control device 30 in the form of a normally open proportional valve and a second micromechanical fluid control device 32 in the form of a pressure sensor. Reference herein to a micromechanical fluid control device contemplates any device that is exposed to a fluid and operates to sense or control the fluid.

The first micromechanical fluid control device 30 includes a membrane 34 and a membrane control chamber 36. Fluid in the membrane control chamber 36 is selectively heated, thereby expanding the volume of the membrane control chamber 36, causing the membrane 34 to deflect and thereby obstruct fluid flow from the input port 22. By controlling the deflection of the membrane 34 in this manner, a proportional valve operation is achieved.

The second micromechanical fluid control device 32 also includes a membrane 38. The deflection of the membrane 38 is used to measure the pressure of the controlled fluid. Thus, the second micromechanical fluid control component 32 operates as a pressure sensor.

Each micromechanical fluid control component (30, 32) is mounted on the manifold 20 using a soft, compliant material 40, such as silicone or epoxy. Ideally, no stresses from the manifold 20 are transmitted to the fluid control components. Isolation of stresses is particularly important in the case of a pressure sensor (e.g. piezoresistive, capacitive, or strain pressure sensors). Pressure sensors are sensitive to the strain of the supporting structure (e.g., a manifold). In particular, if this strain changes over time, the signal produced by the sensor for a given pressure will change, thus decreasing the utility of the sensor.

Although soft, compliant materials have been used with some success, these materials are inappropriate for a large class of applications. In particular, these materials are inappropriate for use in the control and distribution of gases for semiconductor processing. In this context, the gases may be corrosive or toxic. The adhesive 40 between the manifold 20 and fluid control component 30, 32 must withstand this corrosive and/or toxic substance so that there is no observable change in the functionality of the adhesive 40.

Furthermore, semiconductor processing equipment also requires a high level of cleanliness. The fluid control components and their attachment material must not measurably alter the character of the controlled fluid. This limitation eliminates many soft, compliant materials from consideration as candidates for component attachment.

Ideally the adhesive is hermetic. However, hermetic seals are typically quite hard, and therefore transfer package stress directly to the micromechanical fluid control component. The adhesive should also be stable, such that signal drift does not develop over time.

In view of the foregoing, it would be highly desirable to provide an improved technique for mounting fluid control components. Ideally, such a technique would provide a stable, hermetic, clean, and corrosion resistant interface between a fluid control component and a manifold.

SUMMARY OF THE INVENTION

The method of the invention includes the step of forming a first ring of a first adhesive around an aperture defined between a micromechanical fluid control device and a substrate. The first adhesive forms a first interface between the micromechanical fluid control device and the substrate that is clean and corrosion resistant. A second ring of a second adhesive is applied around the first ring. The second adhesive forms a second interface between the micromechanical fluid control device and the substrate that is hermetic.

The apparatus of the invention is a micromechanical fluid control system with a first adhesive ring formed around an aperture defined between a micromechanical fluid control device and a substrate. The first adhesive ring forms a first interface between the micromechanical fluid control device and the substrate that is clean and corrosion resistant. A second adhesive ring is formed around the first adhesive ring. The second adhesive ring forms a second interface between the micromechanical fluid control device and the substrate that is hermetic.

The invention provides a stable, hermetic, clean, and corrosion resistant interface between a fluid control component and a manifold.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
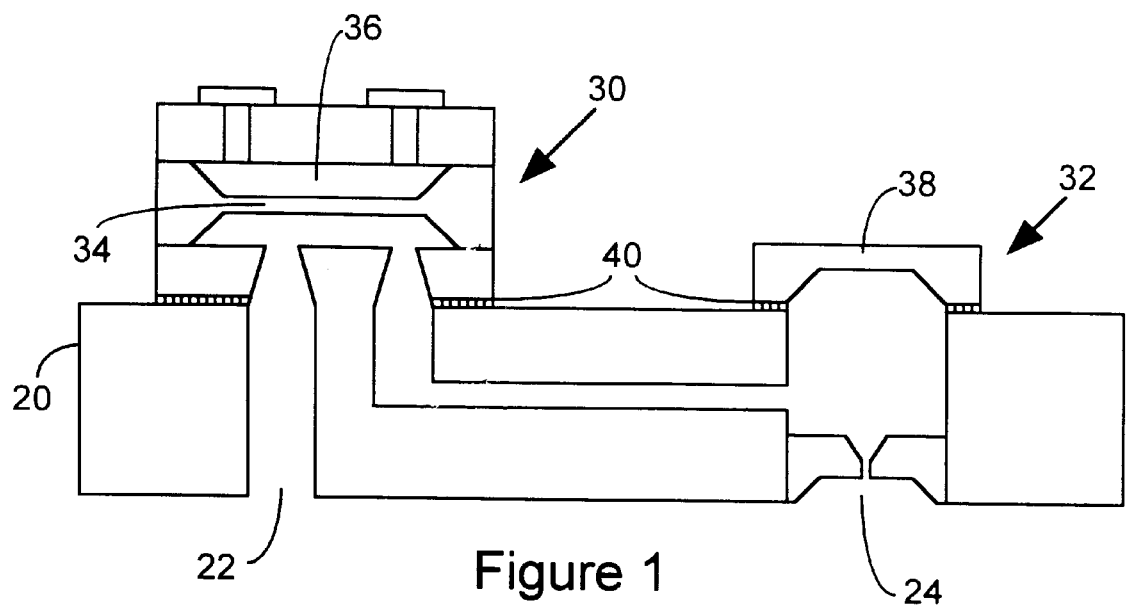
FIG. 1 illustrates a prior art manifold with a set of micromechanical fluid control components positioned thereon.
Figure 2:
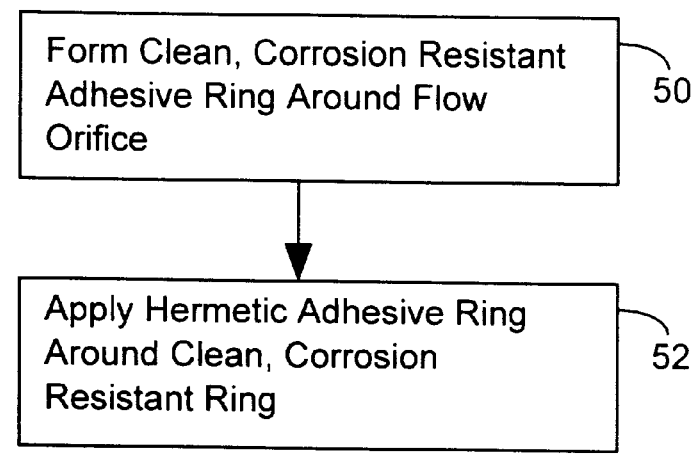
FIG. 2 illustrates processing steps performed in accordance with an embodiment of the invention.

FIG. 2 illustrates processing steps associated with an embodiment of the invention. The first processing step illustrated in FIG. 2 is to form a clean, corrosion resistant adhesive ring around a flow orifice (step 50). This operation can be appreciated with reference to FIG. 3.

Figure 3:
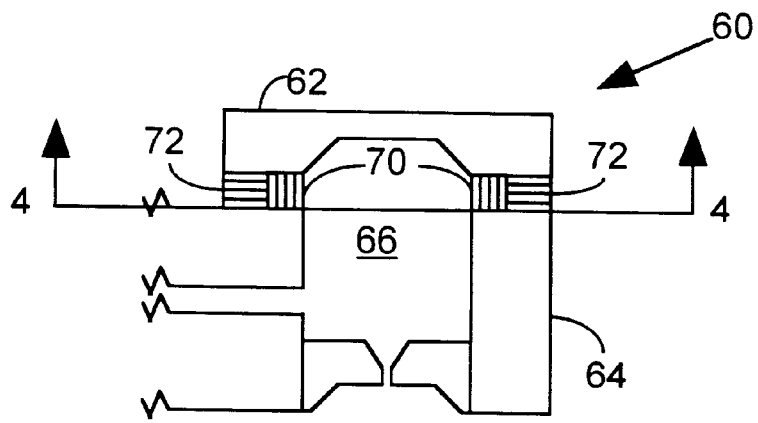
FIG. 3 illustrates a manifold with a micromechanical fluid control component mounted thereon with the concentric adhesive technique of the invention.

FIG. 3 is a side cross-sectional view of a substrate 64 in the form of a fluid manifold. Attached to the substrate 64 is a fluid control device 62 implemented as a pressure sensor. An aperture 66 is defined between the flow control device 62 and the substrate 64. The aperture 66 allows a fluid to pass through the substrate 64 and be in fluid communication with the fluid control device 62.

FIG. 3 also illustrates a first ring 70 formed around the aperture 66. The first ring 70 is positioned between the substrate 64 and the fluid control device 62. The first ring 70 is formed of a first adhesive. The first ring 70 forms an interface that is clean and corrosion resistant. The first adhesive is clean in that it does not measurably alter the chemical or physical properties of a fluid applied to the fluid control device 62. In other words, the first adhesive is a material (the "wetted" material) that does not measurably alter the utility of the controlled fluid (the "wetting" fluid), either by adding to or subtracting from the chemical or physical constituents and properties of the controlled fluid.

The first adhesive is corrosion resistant in that exposure of the first interface to a fluid applied to the flow control device 62 produces no observable change in the functionality of the interface. For example, there is no observable change in permeability and peel strength. Other associated parameters include fluid solubility, yield strength, ductility and temperature coefficient of expansion. Historically, no observable change means no visual change, such as pitting. As new testing requirements have come along, it has come to mean no change in physical or other properties, e.g., strength, ductility, composition, and the like.

Preferably, the first adhesive is a polymer composite. In one embodiment of the invention, the polymer composite is a polytetrafluoroethylene filled bismaleimide based adhesive, such as QM1 561 or QMI 536 sold by QUANTUM MATERIALS, INC., San Diego, Calif. QMI 536 was specifically developed for bonding integrated circuits to polymer surfaces. For QMI 536, the solubility of moisture in the adhesive is very low, but the permeability is high. This feature permits exhausting water to escape from the die bond zone without causing defects when mounting integrated circuits.

The high permeability of the adhesive has implied that the substance is not appropriate for mounting of micromechanical fluid control devices. The clean and corrosion resistant characteristics of this adhesive are typically not utilized in the context of mounting integrated circuits, but are fully exploited in connection with the mounting of micromechanical fluid control devices. Thus, certain properties of the adhesive (e.g., cleanliness and corrosion resistance) have been overlooked in the prior art, while other properties (e.g., permeability) have taught against the use of this adhesive for mounting micromechanical fluid control devices, as disclosed herein.

The first adhesive 70 may be applied to either the substrate 64 or the micromechanical fluid control device 62. The first adhesive may be deposited in accordance with any number of known prior art techniques, including single or multi-needle tips using computer controlled pressure dispensers.

Returning to FIG. 2, the second processing step is to apply a hermetic adhesive ring around the clean, corrosion resistant ring (step 52). FIG. 3 is a cross-sectional illustration of a hermetic adhesive ring 72 positioned around the first clean, corrosion resistant ring 70 and positioned between the substrate 64 and the micromechanical fluid control device 62.

Figure 4:
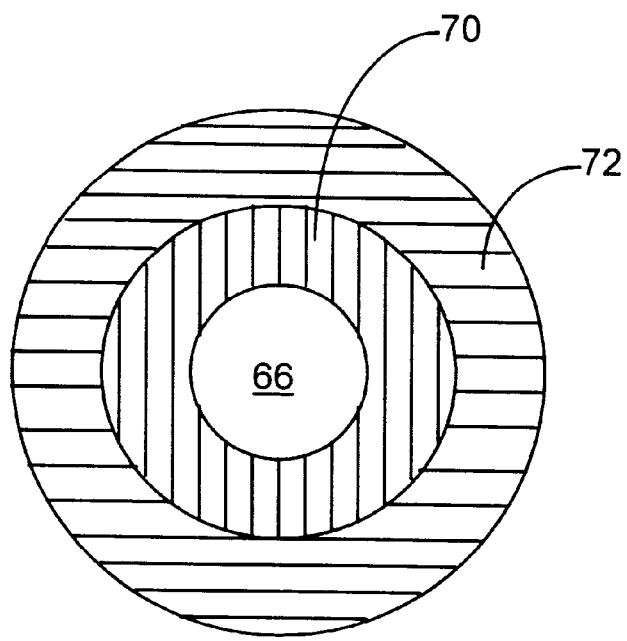
FIG. 4 is a sectional view taken along the line 4—4 of FIG. 3.

FIG. 4 is a sectional view taken along the line 4—4 of FIG. 3. The figure illustrates the aperture 66, which terminates at the base of the fluid control device 62, as shown in FIG. 62. Recall that the aperture 66 is the void that allows fluid communication between the substrate 64 and the micromechanical fluid control device 62. The figure also illustrates the first adhesive ring 70 surrounding the aperture 66. FIG. 4 also shows a second adhesive ring 72 surrounding the first adhesive ring 70.

The hermetic adhesive ring 72 has low permeability to gases. In particular, the hermetic adhesive ring has a permeability to helium of less than $1 \times 10^{-9}$ atm*scc/sec as determined in an attached state. The hermetic adhesive ring 72 may be formed of an epoxy paste. By way of example, the epoxy past may be a thermally conductive, electrically insulating epoxy paste with inserted Boron Nitride, such as EPOTEK T7109 sold by EPOXY TECHNOLOGY, INC., Billerica, Mass. This epoxy was designed primarily for heat sinking and heat dissipation applications in connection with integrated circuits. In this context, its low permeability property is not exploited.

The second adhesive 72 may be positioned on either the substrate 64 or the fluid control device 62. The second adhesive may be deposited in accordance with any number of known prior art techniques, including single or multi-needle tips using computer controlled pressure dispensers. After the adhesive is deposited, the substrate 64 and the fluid control device 62 are attached and allowed to cure, as specified by the adhesive manufacturer.

The invention has been implemented with the first and second adhesive being applied and cured to a thickness less than 25 microns and preferably between 10–15 microns. Ideally, the two adhesives are separated by a minimum of 0.001 inches during application. Beads of a specific size and composition (e.g., 10 micron glass beads) and $SiO_2$ may be added to the die attach materials to assist in achieving a uniform spacing between the sensor and the substrate.

The interface established by the first and second adhesive rings is very stable. Implemented devices have experienced signal drift of less than 0.5% (FS) per year with temperature excursions between 15° C. to 50° C.

Those skilled in the art will appreciate that the micromechanical fluid control device may be in the form of a variety of devices, including piezoresistive pressure sensors, capacitive pressure sensors, strain sensitive transducers, shut-off valves, mass flow controllers, filters, purifiers, and the like. The substrate on which the micromechanical fluid control device is mounted is typically a fluid manifold, meaning a body with a set of channels including an inlet channel, and outlet channel, and a micromechanical fluid control device access channel.

Sometimes a micromechanical fluid control device is mounted on a pedestal to isolate the device from substrate stresses. The adhesive structure of the invention may be applied to such a pedestal, in which case the pedestal should be viewed as forming a portion of the micromechanical fluid control device.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of attaching a micromechanical fluid control device to a substrate comprising the steps of:

forming a first ring of a first adhesive around an aperture defined between a micromechanical fluid control device and a substrate, said first adhesive forming a first interface between said micromechanical fluid control device and said substrate that is clean and corrosion resistant; and applying a second ring of a second adhesive around said first ring, said second adhesive forming a second interface between said micromechanical fluid control device and said substrate that is hermetic.

2. The method of claim 1 wherein said forming step includes the step of forming said first interface such that said first interface is clean in that it does not measurably alter the chemical or physical properties of a fluid applied to said micromechanical fluid control device.

3. The method of claim 1 wherein said forming step includes the step of forming said first interface such that said first interface is corrosion resistant in that exposure of said first interface to a fluid applied to said micromechanical fluid control device produces no observable change in the functionality of said first interface.

4. The method of claim 1 wherein said applying step includes the step of applying said second interface such that said second interface is hermetic in that it has a permeability to helium of less than $1 \times 10^{-9}$ atm*scc/sec.

5. The method of claim 1 wherein said forming and applying steps are performed with a micromechanical fluid control device in the form of a pressure sensor.

6. The method of claim 5 wherein said forming and applying steps are performed with a micromechanical fluid control device in the form of a piezoresistive pressure sensor.

7. The method of claim 5 wherein said forming an applying steps are performed with a micromechanical fluid control device in the form of a capacitive pressure sensor.

8. The method of claim 1 wherein said forming and applying steps are performed with a micromechanical fluid control device in the form of a strain sensitive transducer.

9. The method of claim 1 wherein said forming and applying steps are performed with a substrate in the form of a fluid manifold.

10. A micromechanical fluid control system, comprising:

a first adhesive ring formed around an aperture defined between a micromechanical fluid control device and a substrate, said first adhesive ring forming a first interface between said micromechanical fluid control device and said substrate that is clean and corrosion resistant; and a second adhesive ring formed around said first adhesive ring, said second adhesive ring forming a second interface between said micromechanical fluid control device and said substrate that is hermetic.

11. The micromechanical fluid control assembly of claim 10, wherein said first adhesive ring is clean in that it does not measurably alter the chemical or physical properties of a fluid applied to said micromechanical fluid control device.

12. The micromechanical fluid control assembly of claim 10, wherein said first adhesive ring is corrosion resistant in that exposure of said first adhesive ring to a fluid applied to said micromechanical fluid control device produces no observable change in the functionality of said first adhesive ring.

13. The micromechanical fluid control assembly of claim 10, wherein said second adhesive ring is hermetic in that it has a permeability to helium of less than $1 \times 10^{-9}$ atm*scc/sec.

14. The micromechanical fluid control assembly of claim 10, wherein said micromechanical fluid control device is a pressure sensor.

15. The micromechanical fluid control assembly of claim 10, wherein said micromechanical fluid control device is a piezoresistive pressure sensor.

16. The micromechanical fluid control assembly of claim 10, wherein said micromechanical fluid control device is a capacitive pressure sensor.

17. The micromechanical fluid control assembly of claim 10, wherein said micromechanical fluid control device is a strain sensitive transducer.

18. The micromechanical fluid control assembly of claim 10, wherein said substrate is a fluid manifold.

\* \* \* \* \*